(12) United States Patent
Jia et al.

(10) Patent No.: US 11,997,886 B2
(45) Date of Patent: May 28, 2024

(54) DISPLAY PANEL AND DISPLAY APPARATUS (71) Applicants: Chengdu BOE Optoelectronics Technology Co., Ltd., Sichuan (CN); BOE TECHNOLOGY GROUP CO., LTD., Beijing (CN)

(72) Inventors: Li Jia, Beijing (CN); Tao Gao, Beijing (CN); Zubin Lv, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 382 days.

(21) Appl. No.: 17/440,934

(22) PCT Filed: Feb. 8, 2021

(86) PCT No.: PCT/CN2021/076045
§ 371 (c)(1),
(2) Date: Sep. 20, 2021

(87) PCT Pub. No.: WO2021/164617
PCT Pub. Date: Aug. 26, 2021

(65) Prior Publication Data
US 2022/0165822 A1 May 26, 2022

(30) Foreign Application Priority Data
Feb. 17, 2020 (CN) .......................... 202010097539.9

(51) Int. Cl.
*H10K 59/124* (2023.01)
*G09F 9/33* (2006.01)
(Continued)

(52) U.S. Cl.
CPC ......... *H10K 59/124* (2023.02); *H10K 59/122* (2023.02); *H10K 77/111* (2023.02); *H10K 2102/311* (2023.02)

(58) Field of Classification Search
CPC ............... H10K 59/124; H10K 77/111; H10K 2102/311
See application file for complete search history.

(56) References Cited

U.S. PATENT DOCUMENTS 10,483,492 B2   11/2019   Kamiya
10,658,617 B2   5/2020    Kajiyama
(Continued)

FOREIGN PATENT DOCUMENTS

CN   105742321 A   7/2016
CN   107527931 A   12/2017
(Continued)

OTHER PUBLICATIONS

China Patent Office, First Office Action dated Mar. 11, 2022, for corresponding Chinese application 202010097539.9.

*Primary Examiner* — Antonio B Crite
(74) *Attorney, Agent, or Firm* — HOUTTEMAN LAW LLC (57) ABSTRACT

The present disclosure provides a display panel and a display apparatus. The display panel includes at least one opening, and further includes: a substrate; a thin film transistor structure layer; a first inorganic passivation layer; an organic planarization layer on a side of the first inorganic passivation layer distal to the thin film transistor structure layer; and a second inorganic passivation layer on a side of the organic planarization layer distal to the first inorganic passivation layer. The second inorganic passivation layer extends toward the first inorganic passivation layer alone a side of the organic planarization layer proximal to the at least one opening and covers an exposed portion of the (Continued)

organic planarization layer on a side of the organic planarization layer proximal to the at least one opening.

20 Claims, 5 Drawing Sheets

(51) Int. Cl.
  *H01L 27/12* (2006.01)
  *H10K 59/12* (2023.01)
  *H10K 59/122* (2023.01)
  *H10K 77/10* (2023.01)
  *H10K 102/00* (2023.01)

(56) References Cited

U.S. PATENT DOCUMENTS

| | | |
|---|---|---|
| 10,775,912 B2 | 9/2020 | Beak et al. |
| 2016/0190389 A1 | 6/2016 | Lee et al. |
| 2018/0108863 A1 | 4/2018 | Kajiyama |
| 2019/0123298 A1 | 4/2019 | Kanaya |
| 2020/0176696 A1 | 6/2020 | Dai |
| 2021/0104705 A1* | 4/2021 | Kim .................. H10K 77/111 |

FOREIGN PATENT DOCUMENTS

| | | |
|---|---|---|
| CN | 107958636 A | 4/2018 |
| CN | 108766977 A | 11/2018 |
| CN | 110045852 A | 7/2019 |
| CN | 110473897 A | 11/2019 |
| CN | 111276496 A | 6/2020 |

\* cited by examiner

DISPLAY PANEL AND DISPLAY APPARATUS

CROSS-REFERENCE TO RELATED APPLICATIONS

The present application claims the priority of the Chinese Patent Application No. 202010097539.9, filed on Feb. 17, 2020, the content of which is incorporated herein by reference in its entirety.

TECHNICAL FIELD

The present disclosure relates to the field of display technology, and in particular, to a display panel and a display apparatus.

BACKGROUND

A curved display screen needs to be stretched at bending regions of four corners thereof, so as to prevent wrinkles of the display screen and the display quality of the display screen from being affected at the bending regions. However, the display screen has a relatively poor stretchability. In order to improve the stretchability of the display screen, a part of the display screen at the bending regions of the four corners needs to be punched to enhance the stretchability of the display screen at the four corners. However, after the display screen is punched, moisture may easily spread from a sidewall of an opening to an OLED (Organic Light-Emitting Diode) device, resulting in failure of the OLED and further damaging the OLED device.

Therefore, the research on the display panel in the display screen needs to be further studied.

SUMMARY

In an aspect, the present disclosure provides a display panel with at least one opening, and the display panel includes: a substrate; a thin film transistor structure layer on the substrate; a first inorganic passivation layer on a side of the thin film transistor structure layer distal to the substrate; an organic planarization layer on a side of the first inorganic passivation layer distal to the thin film transistor structure layer; and a second inorganic passivation layer on a side of the organic planarization layer distal to the first inorganic passivation layer, and the at least one opening at least penetrates through the first inorganic passivation layer, the organic planarization layer and the second inorganic passivation layer, and the second inorganic passivation layer extends toward the first inorganic passivation layer along a side of the organic planarization layer proximal to the at least one opening and covers an exposed portion of the organic planarization layer proximal to the at least one opening.

In some embodiment, the first inorganic passivation layer has a first sidewall proximal to the at least one opening, and the organic planarization layer has a second sidewall proximal to the at least one opening, and the second sidewall is farther away from a central axis of the at least one opening in a direction perpendicular to the substrate than the first sidewall.

In some embodiment, a distance between the second sidewall and the central axis is greater than a distance between the first sidewall and the central axis by 1.5 microns to 2.0 microns.

In some embodiment, the organic planarization layer includes a first organic planarization sub-layer and a second organic planarization sub-layer, the first organic planarization sub-layer is on a side of the first inorganic passivation layer distal to the thin film transistor structure layer, the second organic planarization sub-layer is on a side of the first organic planarization sub-layer distal to the first inorganic passivation layer, the first organic planarization sub-layer has a first sub-sidewall proximal to the at least one opening, and the second organic planarization sub-layer has a second sub-sidewall proximal to the at least one opening.

In some embodiment, a distance between the first sub-sidewall and the central axis is not equal to a distance between the second sub-sidewall and the central axis.

In some embodiment, the second sub-sidewall is farther away from the central axis of the at least one opening in the direction perpendicular to the substrate than the first sub-sidewall.

In some embodiment, a distance between the second sub-sidewall and the central axis is greater than a distance between the first sidewall and the central axis by 3.0 microns to 4.0 microns.

In some embodiment, the distance between the first sub-sidewall and the central axis is greater than the distance between the first sidewall and the central axis by 1.5 microns to 2.0 microns.

In some embodiment, the display panel further includes a groove surrounding the at least one opening, and the groove penetrates through the second inorganic passivation layer and at least a portion of the second organic planarization sub-layer in the direction perpendicular to the substrate.

In some embodiment, the display panel further includes a groove surrounding the at least one aperture, and the groove penetrates through the second inorganic passivation layer, the second organic planarization sub-layer, and at least a portion of the first organic planarization sub-layer in the direction perpendicular to the substrate.

In some embodiment, the display panel further includes a first conductive structure on a side of the first organic planarization sub-layer distal to the substrate and electrically coupled to a source of a thin film transistor in the thin film transistor structure layer through a via hole passing through the first organic planarization sub-layer and the first inorganic passivation layer; a second conductive structure on a side of the first organic planarization sub-layer distal to the substrate and electrically coupled to a drain of the thin film transistor in the thin film transistor structure layer through a via hole passing through the first organic planarization sub-layer and the first inorganic passivation layer; a pixel defining layer on a side of the second inorganic passivation layer distal to the second organic planarization layer and having at least one aperture exposing the second inorganic passivation layer; and a light emitting device, which includes a first electrode, a light emitting layer, and a second electrode, and the first electrode and the light emitting layers are in one of the at least one aperture, the second electrode covers the light emitting layer and an exposed portion of the pixel defining layer, and the first electrode is electrically coupled to the second conductive structure through a via hole passing through the second inorganic passivation layer and the second organic planarization sub-layer.

In some embodiment, the substrate includes a first flexible base substrate, a first barrier layer, a second flexible base substrate, and a second barrier layer sequentially provided, and the thin film transistor structure layer is on a side of the second barrier layer distal to the second flexible base substrate, the at least one opening further satisfies any one of the following: the at least one opening further penetrates through the second barrier layer, or the at least one opening further penetrates through the second barrier layer and the second flexible base substrate; or the at least one opening further penetrates through the second barrier layer, the second flexible base substrate, and the first barrier layer; or the at least one opening further penetrates through the second barrier layer, the second flexible base substrate, the first barrier layer, and the first flexible base substrate.

In some embodiment, the display panel includes at least one bending region, and the at least one opening is in the at least one bending region.

In some embodiment, the at least one bending region is at corners of the display panel.

In an aspect, the present disclosure provides a display apparatus including the above display panel, and a driving circuit for driving the display panel.

DETAILED DESCRIPTION

Embodiments of the present disclosure are described in detail below. The embodiments described below are exemplary, and are only used to explain the present disclosure, and should not be construed as limiting the present disclosure. If the specific technology or conditions are not indicated in the examples, it shall be carried out in accordance with the technology or conditions described in the literature in the art or in accordance with the product specification.

Figure 1:
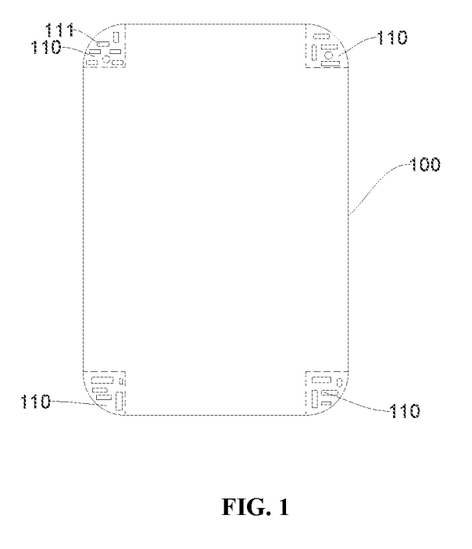
FIG. 1 is a plan view of a display panel according to an embodiment of the present disclosure.
Figure 2:
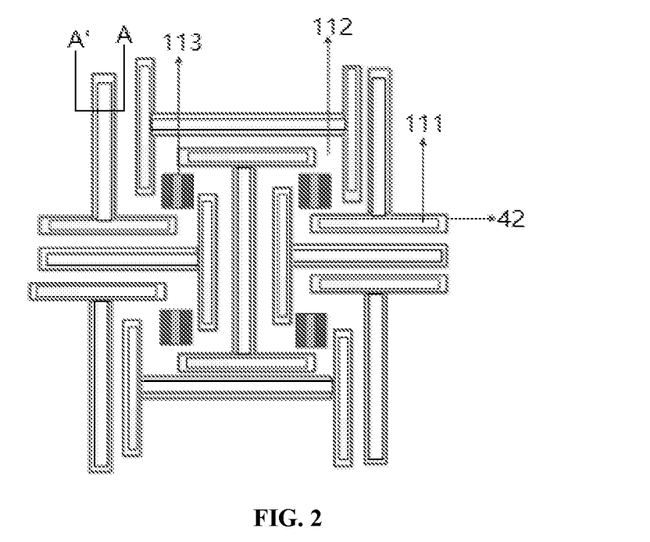
FIG. 2 is an enlarged view of a bending region of FIG. 1.
Figure 3:
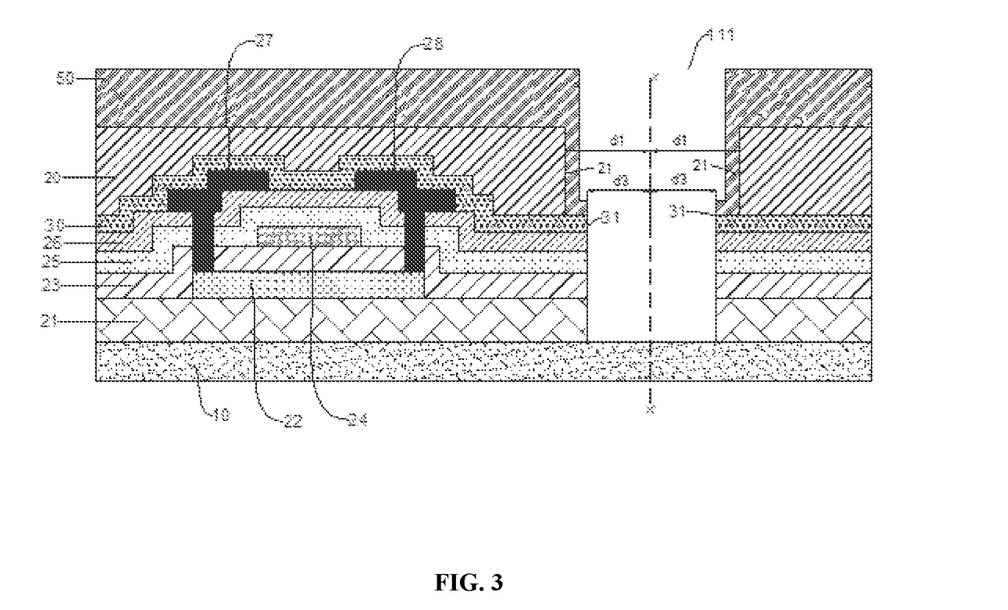
FIG. 3 is a cross-sectional view taken along a line AA' in FIG. 2 according to an embodiment of the present disclosure.

In one aspect, the present disclosure provides a display panel. According to an embodiment of the present disclosure, referring to FIG. 1 (FIG. 1 is an expanded schematic view of a display panel 100) and FIG. 2 (FIG. 2 is an enlarged view of a certain bending region 110 in FIG. 1), the display panel 100 includes at least one bending region 110 provided with at least one opening 111. Referring to FIG. 3 (FIG. 3 is a cross-sectional view taken along a line AA' in FIG. 2), the display panel 100 includes: a substrate 10; a thin film transistor structure layer on the substrate 10; a first inorganic passivation layer (PVX) 30 on a side of the thin film transistor structure layer distal to the substrate 10; an organic planarization layer (PLN) 20 on a side of the first inorganic passivation layer 30 distal to the substrate 10; and a second inorganic passivation layer 50 on a side of the organic planarization layer 20 distal to the substrate 10. As shown in FIG. 3, the at least one opening 111 penetrates through at least the first inorganic passivation layer 30, the organic planarization layer 20 and the second inorganic passivation layer 50. In addition, the second inorganic passivation layer 50 extends toward the first inorganic passivation layer 30 along a side of the organic planarization layer 20 proximal to the at least one opening 111, and covers an exposed portion of the organic planarization layer 20 proximal to the at least one opening.

Since moisture and oxygen are relatively easily permeated into an organic material, the moisture and oxygen may enter the organic planarization layer through the portion of the organic planarization layer exposed to the opening 111, and then spread into an OLED device through the organic planarization layer (due to a patterned structure of the second inorganic passivation layer, which cannot prevent the spread of the moisture and oxygen into the OLED device). Therefore, in the present disclosure, the organic planarization layer 20 is covered by the dense second inorganic passivation layer 50, so that the moisture and oxygen can be prevented from spreading into the OLED device, the OLED device is prevented from being damaged by the moisture and oxygen, a service life of the display panel is lengthened and display quality of the display panel is enhanced.

According to an embodiment of the present disclosure, the display panel further includes a groove as a recess blocking structure surrounding the at least one opening (an insulation pillar is formed on a side of the groove proximal to the opening 111, as shown in FIGS. 6 to 9). Typically, the groove surrounding the at least one opening prevents the moisture and oxygen from entering an organic light emitting material layer in the OLED device through a portion of the OLED exposed to the opening 111 (e.g., a cathode, cathodes of OLEDs of the display panel are typically formed as a single piece and are disconnected at the groove), thereby damaging the OLED device. In a case where the groove fails to block cathode connection, namely in a case where the cathodes of the OLED devices are connected in the groove, the cathodes of the OLED devices may be in contact with organic material layers (such as an organic planarization layer) below the cathodes, so that the moisture and oxygen may enter the cathodes of the OLED devices through the organic planarization layer and further reach light emitting layers of the OLED devices, thereby influencing light emitting of the OLED devices and damaging the OLED devices. In the present disclosure, by enabling the second inorganic passivation layer 50 to extend toward the first inorganic passivation layer 30 along the side of the organic planarization layer 20 proximal to the at least one opening 111 and to cover the exposed portion of the organic planarization layer 20 on a side of the organic planarization layer 20 proximal to the at least one opening 111, i.e., the second inorganic passivation layer 50 and the first inorganic passivation layer 30 cover the organic planarization layer 20 without being exposed to the at least one opening 111, the moisture and oxygen cannot penetrate through the dense second inorganic passivation layer 50 and the first inorganic passivation layer 30 to enter the organic planarization layer 20. Thus, even if the groove fails to block the cathode connection, the moisture and oxygen cannot enter the organic planarization layer 20 through the dense second inorganic passivation layer 50 and the first inorganic passivation layer 30, and cannot further enter the OLED device, thereby protecting the OLED device, lengthening the service life of the display panel and enhancing the display quality of the display panel.

According to an embodiment of the present disclosure, as shown in FIG. 3, the first inorganic passivation layer 30 has a first sidewall 31 proximal to the at least one opening 111, and the organic planarization layer 20 has a second sidewall 21 proximal to the at least one opening 111. The second sidewall is farther away from a central axis XX' of the at least one opening 111 in a direction perpendicular to the substrate 10 than the first sidewall 31. That is, in the present disclosure, a distance dl between the second sidewall 21 of the organic planarization layer 20 proximal to the opening 111 and the central axis XX' is greater than a distance d3 between the first sidewall 31 of the first inorganic passivation layer 30 proximal to the opening 111 and the central axis XX', that is, the organic planarization layer 20 and the first inorganic passivation layer 30 form a structure similar to a "step" at a side proximal to the opening, so that the second inorganic passivation layer 50 extends to the "step" along the side of the organic planarization layer 20 proximal to the at least one opening 111 and covers the organic planarization layer 20. By the "step", it is advantageous to enable the second inorganic passivation layer 50 to fall on the "step" for covering the organic planarization layer 20.

According to the embodiment of the present disclosure, as shown in FIG. 3, the distance between the second sidewall 21 and the central axis XX' is greater than the distance between the first sidewall 31 and the central axis XX' by 1.5 microns to 2.0 microns. That is, the "step" has a width of 1.5 microns to 2.0 microns in a direction away from the central axis XX'. Alternatively, the width may be 1.6 microns, 1.7 microns, 1.8 microns, or 1.9 microns, but may be other desired width values.

Figure 4:
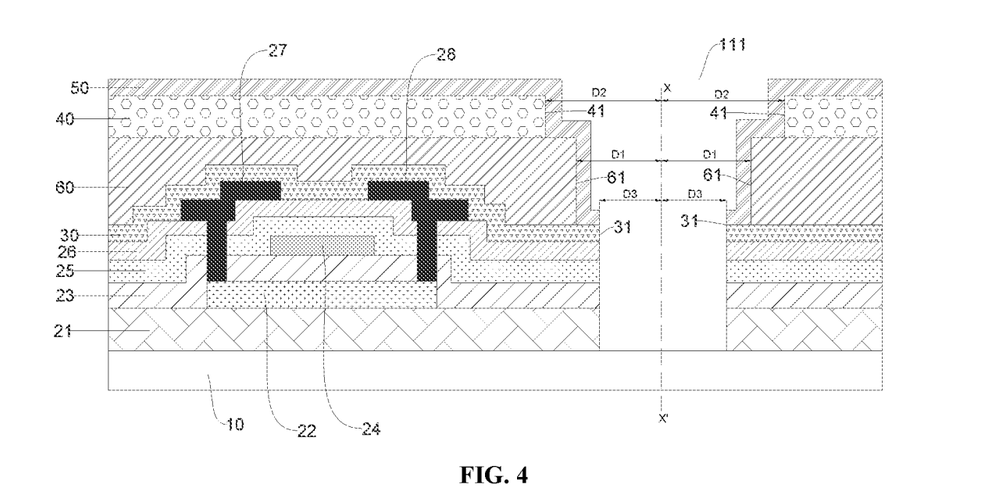
FIG. 4 is a cross-sectional view taken along a line AA' in FIG. 2 according to an embodiment of the present disclosure.

According to an embodiment of the present disclosure, as shown in FIG. 4, the organic planarization layer 20 includes a first organic planarization sub-layer 60 and a second organic planarization sub-layer 40. The first organic planarization sub-layer 60 is on a side of the first inorganic passivation layer 30 distal to the thin film transistor structure layer, and the second organic planarization sub-layer 40 is on a side of the first organic planarization sub-layer 60 distal to the first inorganic passivation layer 30. The first organic planarization sub-layer 60 has a first sub-sidewall 61 proximal to the at least one opening 111 and the second organic planarization sub-layer 40 has a second sub-sidewall 41 proximal to the at least one opening 111. A distance between the first sub-sidewall 61 and the central axis XX' is not equal to a distance between the second sub-sidewall 41 and the central axis XX'. Specifically, the second sub-sidewall 41 may be farther away from the central axis XX' of the at least one opening 111 in the direction perpendicular to the substrate 10 than the first sub-sidewall 61.

As shown in FIG. 4, by the distance D1 between the first sub-sidewall 61 of the first organic planarization sub-layer 60 proximal to the opening 111 and the central axis XX' being greater than the distance D3 between the first sidewall 31 of the first inorganic passivation layer 30 proximal to the opening and the central axis XX', and the distance D2 between the second sub-sidewall 41 of the second organic planarization sub-layer 40 proximal to the opening 111 and the central axis of the opening 111 being greater than the distance D1 between the first sub-sidewall 61 of the first organic planarization sub-layer 60 proximal to the opening and the central axis (i.e., with respect to the first sidewall 31 of the first inorganic passivation layer, the first organic planarization sub-layer 60 and the second organic planarization sub-layer 40 are sequentially retracted), the second inorganic passivation layer 50 covers the second sub-sidewall 41 of the second organic planarization sub-layer 40 and the first sub-sidewall 61 of the first organic planarization sub-layer 60.

That is, the first organic planarization sub-layer 60 and the first inorganic passivation layer 30 form one "step" structure, and the second organic planarization sub-layer 40 and the first organic planarization sub-layer 60 form another "step" structure. The second inorganic passivation layer 50 extends along the above two "steps" to cover the first organic planarization sub-layer 60 and the second organic planarization sub-layer 40. In this way, the moisture and oxygen may be prevented from contacting the second sub-sidewall 41 of the second organic planarization sub-layer 40 and the first sub-sidewall 61 of the first organic planarization sub-layer 60, thereby effectively preventing the moisture from spreading from the sidewall of the opening 11 into the OLED device. Moreover, the difference in widths in the direction far away from the central axis XX' of the second sub-sidewall 41 of the second organic planarization layer and the first sub-sidewall 61 of the first organic planarization layer form a "step", which reduces the step difference of the second inorganic passivation layer 50 when covering the first sub-sidewall 61 of the first organic planarization layer 60 proximal to the opening and the second sub-sidewall 41 of the second organic planarization layer 40 proximal to the opening, so as to avoid the portion of the second inorganic passivation layer 50 from breaking covering the first sub-sidewall 61 of the first organic planarization layer 60 proximal to the opening and the second sub-sidewall 41 of the second organic planarization layer 40 proximal to the opening, otherwise the effect of the second inorganic passivation layer 50 on preventing the moisture and oxygen would be greatly reduced.

According to an embodiment of the present disclosure, referring to FIG. 1, the display panel includes at least one bending region 110 generally at four corners thereof. In this way, the stretching performance of the display screen at the corners can be enhanced when the curved screen is manufactured (for example, the at least one opening 111 is provided in the bending region 110) if a better stretching performance in the bending region 110 is required, thereby avoiding the display screen being wrinkled. The specific shape and size of the opening 111 are not particularly limited, and the opening 111 may be in a volume of a cuboid (see FIG. 2), a cylinder, or the like. In addition, the number of the openings in the bending region 110 at each of the corners is not particularly limited, and may be flexibly selected according to the actual situation such as a requirement for stretchability of the bending region by those skilled in the art, which is not limited herein. Moreover, the number, the shape and the size of the openings at different bending regions 110 may be the same or different.

According to an embodiment of the disclosure, the specific structure of the thin film transistor structure layer is not particularly required in the present disclosure, and may be designed flexibly by those skilled in the art according to actual situation. Thin film transistors in the thin film transistor structure layer may be of a top gate structure or a bottom gate structure. In some embodiments, referring to FIG. 4 (taking a thin film transistor of a top gate structure as an example in FIG. 4), the thin film transistor structure layer includes a buffer layer 21 on a surface of the substrate 10; an active layer 22 on a side of the buffer layer 21 distal to the substrate 10; a first gate insulating layer 23 on a side of the buffer layer 21 distal to the substrate and covering the active layer 22; gate electrodes 24 on a side of the first gate insulating layer 23 distal to the substrate; a second gate insulating layer 25 on a side of the gate electrodes 24 distal to the substrate, and covering the gate electrodes 24 and exposed portion of the first gate insulating layer 23; an interlayer dielectric layer 26 on a side of the second gate insulating layer 25 distal to the substrate; and source electrodes 27 and drain electrodes 28 on a side of the interlayer dielectric layer 26 distal to the substrate, and respectively electrically coupled to the active layer 22 through via holes.

It should be noted that, the thin film transistor structure layer described above may also be penetrated by openings 111, and the regions penetrated by the openings 111 is the regions of the thin film transistor structure layer where the thin film transistors (including an active layer, a gate, a source, and a drain, and the like) are not located, that is, the penetrated structure includes the buffer layer 21, the first gate insulating layer 23, the second gate insulating layer 25, the interlayer dielectric layer 26, and the like. Thus, the openings 111 do not affect the normal display in the bending region. As shown in FIG. 2, the openings 111 are in a non-pixel region, that is, the openings 111 are in the non-pixel region between pixel units 113, and the layout design of a signal line region 112 is not affected by the openings 111.

According to an embodiment of the present disclosure, after the second inorganic passivation layer 50 is formed, the OLED devices are formed on the side of the second inorganic passivation layer 50 distal to the second organic planarization sub-layer 40, so that the structure of the above display panel may be formed before the formation of the OLED devices, and thus, the moisture and oxygen may be prevented from penetrating from the sidewall of the organic planarization layer. Moreover, since the second inorganic passivation layer 50 is formed before the formation of the OLED devices, a high-temperature (about 200° C.) vapor deposition process may be used to manufacture the second inorganic passivation layer 50, so as to enhance the density of the second inorganic passivation layer 50, and further enhance the moisture and oxygen resistance of the second inorganic passivation layer 50.

Figure 5:
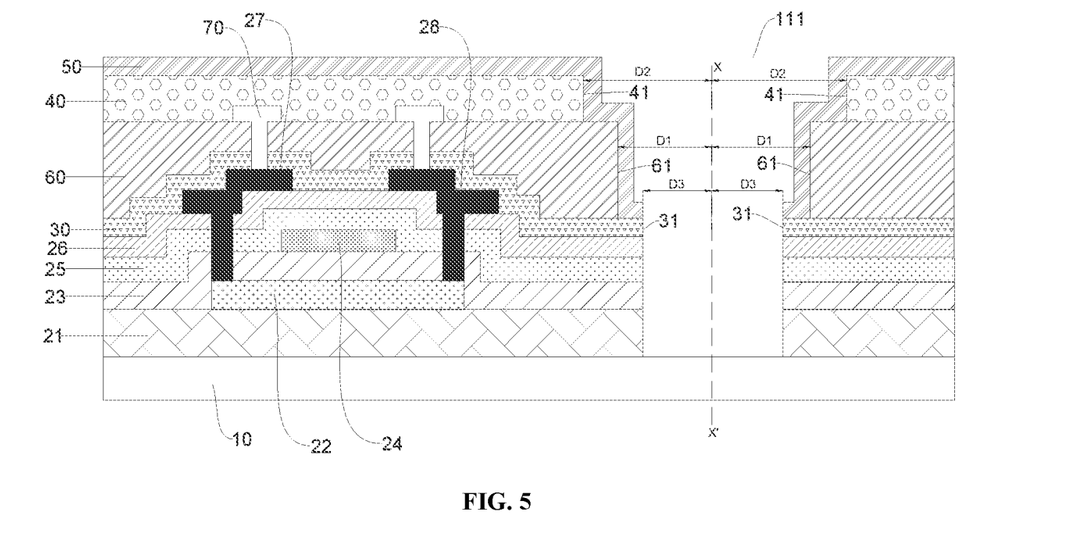
FIG. 5 is a schematic view illustrating a structure of a display panel according to an embodiment of the present disclosure.
Figure 8:
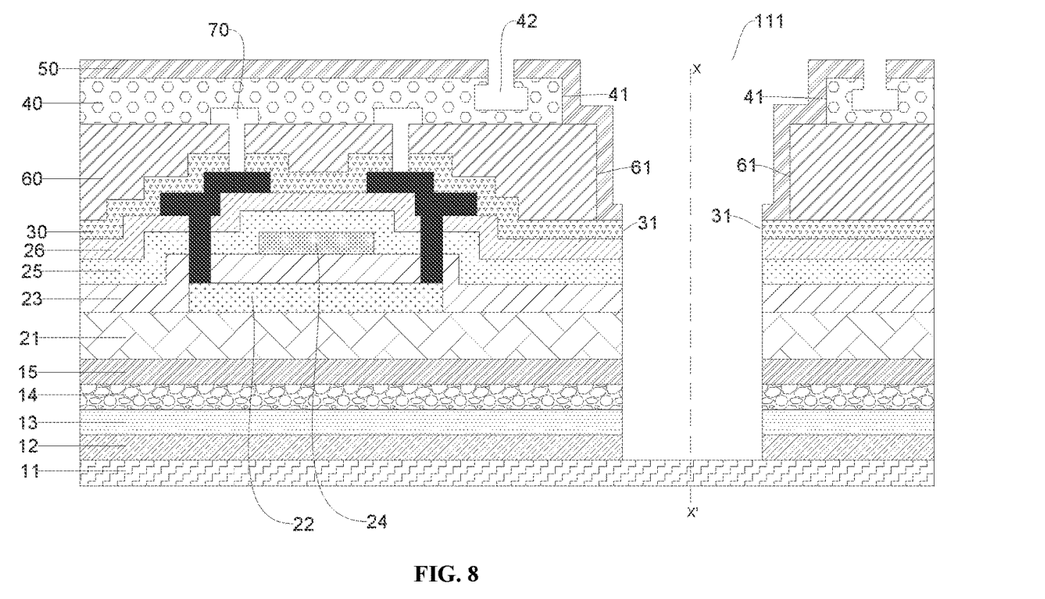
FIG. 8 is a schematic view illustrating a structure of a display panel according to an embodiment of the present disclosure.

According to an embodiment of the present disclosure, referring to FIG. 5, the display panel 100 may further include: a conductive structure 70 on a side of the first organic planarization sub-layer 60 distal to the substrate 10 and electrically coupled to the source or the drain of the thin film transistor in the thin film transistor structure layer through via holes; a pixel defining layer; and light emitting devices on a side of the second inorganic passivation layer 50 distal to the second organic planarization sub-layer 40. Specifically, as shown in FIG. 8, the conductive structure 70 includes: a first conductive structure 71 on a side of the first organic planarization sub-layer 60 distal to the substrate 10 and electrically coupled to the source of the thin film transistor in the thin film transistor structure layer through a via hole extending through the first organic planarization sub-layer 60 and the first inorganic passivation layer 30; and a second conductive structure 72 on a side of the first organic planarization sub-layer 60 distal to the substrate 10 and electrically coupled to the drain of the thin film transistor in the thin film transistor structure layer through a via hole extending through the first organic planarization sub-layer 60 and the first inorganic passivation layer 30. The first conductive structure 71 may be an auxiliary power line, which is coupled to power lines on a same layer as sources and drains of the thin film transistors, and operating voltages are provided to the source of the thin film transistor through the first conductive structure 71, so as to further reduce circuit impedance.

According to an embodiment of the present disclosure, referring to FIGS. 4 and 5, the distance between the second sub-sidewall 41 and the central axis XX' is greater than the distance between the first sidewall 31 and the central axis XX' by 3.0 microns to 4.0 microns, for example, greater by 3.1 microns, 3.2 microns, 3.3 microns, 3.4 microns, 3.5 microns, 3.6 microns, 3.7 microns, 3.8 microns, or 3.9 microns. The distance between the first sub-sidewall 61 and the central axis XX' is greater than the distance between the first sidewall 31 and the central axis XX' by 1.5 microns to 2.0 microns, for example, greater by 1.6 microns, 1.7 microns, 1.8 microns or 1.9 microns. Specifically, as shown in FIGS. 4 and 5, the distance D2 between the second sub-sidewall 41 of the second organic planarization sub-layer 40 proximal to the opening and the central axis XX' of the opening 111 is greater than the distance D3 between the first sidewall 31 of the first inorganic passivation layer 30 proximal to the opening and the central axis XX' by 3.0 microns to 4.0 microns (i.e., the difference between D2 and D3 is in a range of 3.0 microns to 4.0 microns). The distance D1 between the first sub-sidewall 61 of the first organic planarization sub-layer 60 proximal to the opening and the central axis XX' is greater than the distance D3 between the first sidewall 31 of the first inorganic passivation layer 30 proximal to the opening and the central axis XX' by 1.5 microns to 2.0 microns (i.e., the difference between D1 and D3 is in a range of 1.5 microns to 2.0 microns). Therefore, not only the second sub-sidewall 41 of the second organic planarization sub-layer 40 and the first sub-sidewall 61 of the first organic planarization sub-layer 60 have different distances from the central axis XX' in the direction far away from the central axis XX' to form a "step", but also the opening 111 does not have a too large size.

Figure 6:
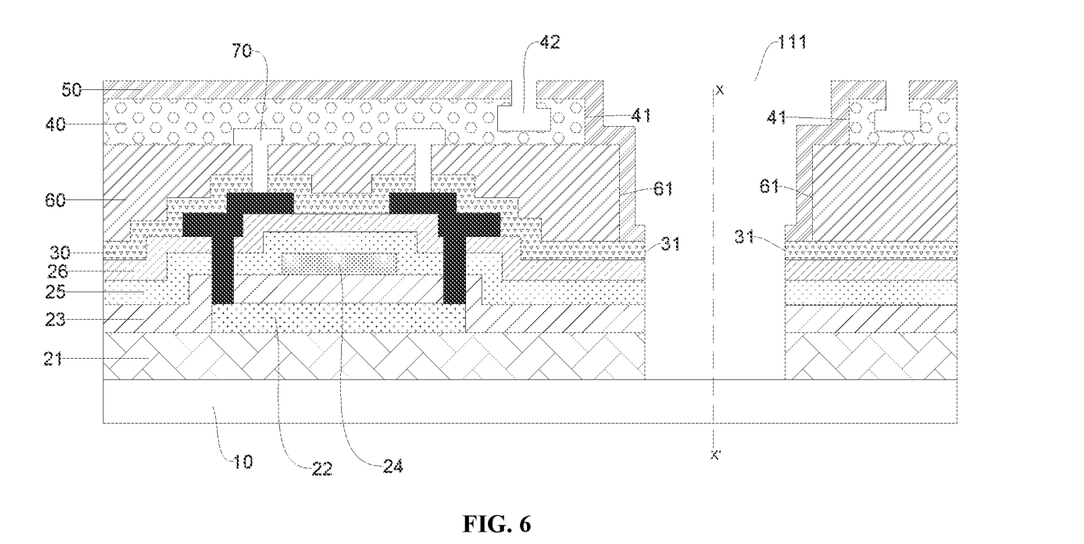
FIG. 6 is a schematic view illustrating a structure of a display panel according to an embodiment of the present disclosure.
Figure 7:
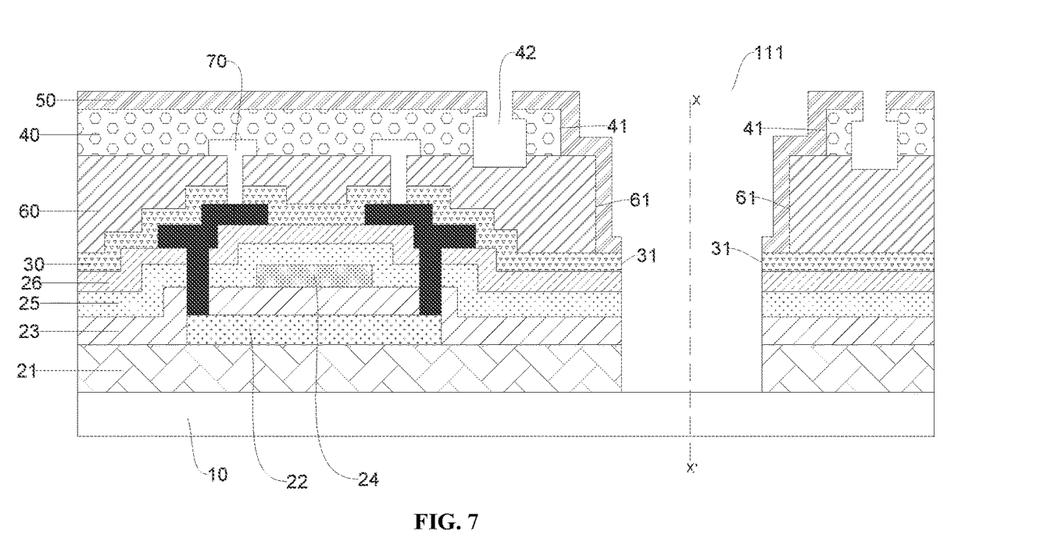
FIG. 7 is a schematic view illustrating a structure of a display panel according to an embodiment of the present disclosure.

According to an embodiment of the present disclosure, referring to FIGS. 6 and 7, the recess blocking structure 42 is a groove that penetrates through the second inorganic passivation layer 50 and at least a portion of the second organic planarization sub-layer 40 in the direction perpendicular to the substrate 10. The groove surrounds the opening 111. The second inorganic passivation layer 50 and the portion of the second organic planarization sub-layer 40, which are higher than a bottom of the groove in the direction perpendicular to the substrate 10 at a side proximal to the opening 111, form an insulation pillar. Therefore, when the OLED devices are manufactured subsequently, the cathodes as a single piece of the OLEDs in a normal light emitting region and the cathode materials around the opening 111 may be effectively blocked and disconnected at the groove, so that the moisture and oxygen are prevented from spreading into the light emitting materials of the OLEDs in the normal light emitting region from the cathode materials around the opening 111, and further the light emitting materials in the OLED devices can be further effectively prevented from failure due to corrosion of the moisture and oxygen.

The groove of the recess blocking structure 42 may not penetrate through the second organic planarization sub-layer 40 (i.e., the groove of the recess blocking structure 42 has a depth less than the sum of the thickness of the second organic planarization sub-layer 40 and the thickness of the second inorganic passivation layer 50). In other examples, the groove of the recess blocking structure 42 may penetrate just through the second organic planarization sub-layer 40 (i.e., the groove of the recess blocking structure 42 has a depth equal to the sum of the thickness of the second organic planarization sub-layer 40 and the thickness of the second inorganic passivation layer 50). The depth of the groove can be flexibly designed by those skilled in the art according to the actual requirement.

According to an embodiment of the present disclosure, referring to FIG. 7, the groove of the recess blocking structure 42 may penetrate through the second organic planarization sub-layer 40 and extend to the first organic planarization sub-layer 60. Therefore, the depth of the recess blocking structure is increased, and the cathodes as a single piece of the OLEDs in the normal light emitting region can be further ensured to be blocked at the groove from the cathode material around the opening 111.

Referring to FIGS. 6 and 7, in manufacturing the recess blocking structure 42, the recess blocking structure 42 may be manufactured by an etch patterning process after forming the second inorganic passivation layer 50. In this way, the recess blocking structure is not filled with the material of the second inorganic passivation layer, and the step of removing the material of the second inorganic passivation layer in the recess blocking structure 42 can be avoided. Therefore, the cathode material can be blocked by the recess blocking structure 42 with a smaller size, and the manufacturing cost of the recess blocking structure is further reduced.

Furthermore, there is no special requirement on the specific shape of the recess blocking structure, and the specific shape of the recess blocking structure may be flexibly selected by those skilled in the art according to actual situation. Inner diameters of recess blocking structures may or may not be consistent (as shown in FIGS. 6 and 7, the recess blocking structure 42 is composed of a first segment and a second segment that have different inner diameters and are coupled to each other), as long as the light emitting material in the OLED devices can be blocked.

According to an embodiment of the present disclosure, there are no special restrictions on the specific materials of the second organic planarization sub-layer and the first organic planarization sub-layer, and conventional manufacturing materials can be flexibly selected by those skilled in the art according to actual requirement. There are no special restrictions on the materials of the first inorganic passivation layer and manufacturing materials can be flexibly selected by those skilled in the art according to actual requirement, such as silicon nitride, silicon oxide, or silicon oxynitride.

According to an embodiment of the present disclosure, there are no special restrictions on the specific structure of the substrate 10, and a substrate including a flexible base substrate, a barrier layer, and the like may be provided flexibly according to the requirement by those skilled in the art. In some embodiments, referring to FIG. 8, the substrate 10 may include: a rigid base substrate 11 (after a display panel is manufactured, the rigid base substrate 11 needs to be stripped and removed), a first flexible base substrate 12 on a side of the rigid base substrate 11 proximal to the thin film transistor structure layer, a first barrier layer 13 on a side of the first flexible base substrate 12 distal to the rigid base substrate 11, a second flexible base substrate 14 on a side of the first barrier layer 13 distal to the rigid base substrate 11, and a second barrier layer 15 on a side of the second flexible substrate 14 distal to the rigid base substrate 11. Thereby, a flexible display panel may be manufactured.

In some examples, the opening 111 may also penetrate through only the second barrier layer 15. In other examples, the opening 111 may penetrate through only the second barrier layer 15 and the second flexible base substrate 14. In still other examples, the opening 111 may also penetrate through the second barrier layer 15, the second flexible base substrate 14, and the first barrier layer 13. In still other examples, the opening 111 may further penetrate through the second barrier layer 15, the second flexible base substrate 14, the first barrier layer 13, and the first flexible base substrate 12 (see FIG. 8). Thus, the layer structures through which the openings 111 penetrates may be flexibly designed by those skilled in the art according to the requirements for stretchability in the bending region 110.

Specific materials for forming the first flexible base substrate and the second flexible base substrate include, but are not limited to, polyimide (PI), and materials for forming the first barrier layer and the second barrier layer include, but are not limited to, silicon nitride, silicon oxide, silicon oxynitride, metal, and the like. The materials may be selected by those skilled in the art according to actual requirements.

Figure 9:
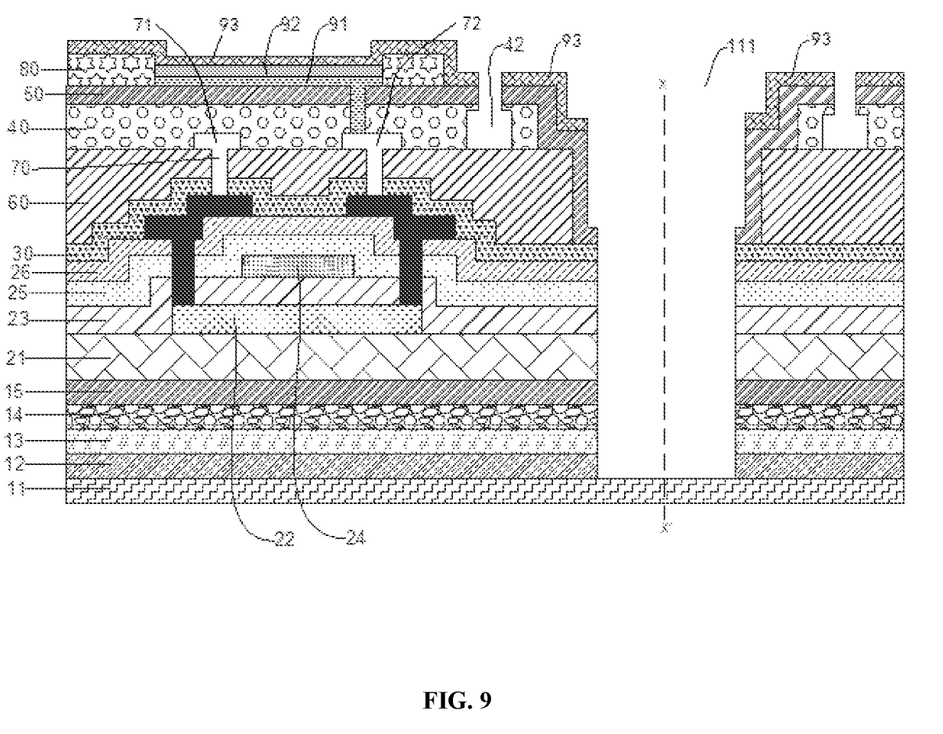
FIG. 9 is a schematic view illustrating a structure of a display panel according to an embodiment of the present disclosure.

As can be understood by those skilled in the art, referring to FIG. 9, the display panel 100 further includes a pixel defining layer 80 on a side of the second inorganic passivation layer 50 distal to the second organic planarization sub-layer 40. The pixel defining layer 80 has a plurality of apertures in which an anode 91 (electrically coupled to the drain through a via hole), a light emitting material layer 92, and a cathode 93 sequentially stacked. As can be seen from FIG. 9, the recess blocking structure 42 can effectively block the cathode material layer in the normal light emitting region from the cathode material layer in the peripheral region of the opening, thereby preventing the moisture and oxygen from permeating into the light emitting material in the normal light emitting region.

In manufacturing the above display panel, when the first organic planarization sub-layer 60 is punched, the openings therein may have a size larger than a size of the openings in the other layers (i.e., the first inorganic passivation layer 30, the second barrier layer 15, the second flexible base substrate 14, the first barrier layer 13, and the first flexible base substrate 12) on a side of the first organic planarization sub-layer 60 distal to the substrate 10, as shown in FIG. 9. When the second organic planarization sub-layer 40 is punched, the openings therein may have a size larger than the size of the first organic planarization sub-layer 60, as shown in FIG. 9. Then, the second inorganic passivation layer 50 is formed on the second organic planarization sub-layer 40, such that the second inorganic passivation layer 50 may extend along the first sub-sidewall 61 of the first organic planarization sub-layer 60 and the second sub-sidewall 41 of the second organic planarization sub-layer 40 to reach the first inorganic passivation layer 30, thereby covering the first organic planarization sub-layer 60 and the second organic planarization sub-layer 40 to prevent the moisture and oxygen from entering the first organic planarization sub-layer 60 and the second organic planarization sub-layer 40 and from further entering the OLED devices. The manufacturing method of the related structure of the display panel is the same as that in the related art, which is not described herein again.

In still another aspect, the present disclosure provides a display apparatus. According to an embodiment of the present disclosure, the display apparatus includes the display panel described above and a driving circuit for driving the display panel. Therefore, the OLEDs in the display apparatus are not easy to be corroded by moisture and oxygen, and the display quality of the display apparatus is enhanced. It can be understood by those skilled in the art that the display apparatus has all the features and advantages of the display panel described above, which will not be described in detail herein.

It should be noted that the display apparatus includes the display panel described above, but those skilled in the art will appreciate that when the substrate in the display panel includes a rigid base substrate, the rigid base substrate needs to be removed after the display panel is manufactured, and therefore the display apparatus does not include the rigid base substrate.

According to an embodiment of the disclosure, there is no special restriction on the specific type of the display apparatus, and the specific type of the display apparatus may be flexibly selected by those skilled in the art according to actual requirements. For example, the display apparatus may be any apparatus or means with display function, such as a mobile phone, a television, a notebook, an iPad, a game console, a kindle, and the like.

It can be understood by those skilled in the art that the display apparatus includes the display panel described above and necessary structures or components of a conventional display panel. For example, a mobile phone includes a package layer, a glass cover plate, an audio module, a camera module, a touch module and other structures in addition to the display panel. In a case where the recess blocking structure fail to block the cathode connection, namely the cathodes of the OLED devices are connected in the recess blocking structure, the packaging layer may also package the cathodes of the OLEDs exposed from the apertures, so that the moisture and oxygen are further prevented from entering the cathodes of the OLEDs.

In the description of the present disclosure, the terms "first" and "second" are only used for descriptive purposes, and cannot be understood as indicating or implying relative importance or implicitly indicating the number of indicated technical features. Thus, the features defined with "first" and "second" may explicitly or implicitly include one or more of these features. In the description of the present disclosure, "a plurality" means two or more than two, unless specifically defined otherwise.

In the description of the specification, descriptions with reference to the terms "an embodiment", "some embodiments", "an example", "a specific example", or "some examples" etc. mean specific features, structures, materials, or characteristics described in conjunction with the embodiment or example are included in at least one embodiment or example of the present disclosure. In the specification, the schematic representations of the above terms do not necessarily refer to the same embodiment or example. Moreover, the described specific features, structures, materials or characteristics can be combined in any one or more embodiments or examples in a suitable manner. In addition, those skilled in the art can combine and assemble the different embodiments or examples and the features of the different embodiments or examples described in the specification without contradicting each other.

Although the embodiments of the present disclosure have been shown and described above, it can be understood that the above mentioned embodiments are exemplary and should not be construed as limiting the present disclosure. Those skilled in the art can make changes, modifications, substitutions and modifications to the above embodiments within the scope of the present disclosure.

What is claimed is:

1. A display panel with at least one opening, the display panel comprising:
a substrate;
a thin film transistor structure layer on the substrate;
a first inorganic passivation layer on a side of the thin film transistor structure layer distal to the substrate;
an organic planarization layer on a side of the first inorganic passivation layer distal to the thin film transistor structure layer; and
a second inorganic passivation layer on a side of the organic planarization layer distal to the first inorganic passivation layer,
wherein the at least one opening at least penetrates through the first inorganic passivation layer, the organic planarization layer and the second inorganic passivation layer, and the second inorganic passivation layer extends toward the first inorganic passivation layer along a side of the organic planarization layer proximal to the at least one opening and covers an exposed portion of the organic planarization layer proximal to the at least one opening;
wherein the first inorganic passivation layer has a first sidewall proximal to the at least one opening, and the organic planarization layer has a second sidewall proximal to the at least one opening, and the second sidewall is farther away from a central axis of the at least one opening in a direction perpendicular to the substrate than the first sidewall;
wherein the organic planarization layer comprises a first organic planarization sub-layer and a second organic planarization sub-layer, the first organic planarization sub-layer is on a side of the first inorganic passivation layer distal to the thin film transistor structure layer, the second organic planarization sub-layer is on a side of the first organic planarization sub-layer distal to the first inorganic passivation layer, the first organic planarization sub-layer has a first sub-sidewall proximal to the at least one opening, and the second organic planarization sub-layer has a second sub-sidewall proximal to the at least one opening; and
the display panel further comprises a groove surrounding the at least one opening, wherein the groove penetrates through the second inorganic passivation layer and at least a portion of the second organic planarization sub-layer in the direction perpendicular to the substrate.

2. The display panel of claim 1, wherein a distance between the second sidewall and the central axis is greater than a distance between the first sidewall and the central axis by 1.5 microns to 2.0microns.

3. The display panel of claim 1, wherein the groove penetrates through the whole second organic planarization sub-layer, and at least a portion of the first organic planarization sub-layer in the direction perpendicular to the substrate.

4. The display panel of claim 1, wherein the substrate comprises a first flexible base substrate, a first barrier layer, a second flexible base substrate, and a second barrier layer sequentially provided, and the thin film transistor structure layer is on a side of the second barrier layer distal to the second flexible base substrate,
wherein the at least one opening further satisfies any one of the following:
the at least one opening further penetrates through the second barrier layer, or
the at least one opening further penetrates through the second barrier layer and the second flexible base substrate; or
the at least one opening further penetrates through the second barrier layer, the second flexible base substrate, and the first barrier layer; or the at least one opening further penetrates through the second barrier layer, the second flexible base substrate, the first barrier layer, and the first flexible base substrate.

5. The display panel of claim 1, wherein a distance between the first sub-sidewall and the central axis is not equal to a distance between the second sub-sidewall and the central axis.

6. The display panel of claim 5, wherein the second sub-sidewall is farther away from the central axis of the at least one opening in the direction perpendicular to the substrate than the first sub-sidewall.

7. The display panel of claim 6, wherein a distance between the second sub-sidewall and the central axis is greater than a distance between the first sidewall and the central axis by 3.0 microns to 4.0 microns.

8. The display panel of claim 7, wherein the distance between the first sub-sidewall and the central axis is greater than the distance between the first sidewall and the central axis by 1.5 microns to 2.0 microns.

9. A display apparatus comprising the display panel of claim 1 and a driving circuit for driving the display panel.

10. The display apparatus of claim 9, wherein a distance between the second sidewall and the central axis is greater than a distance between the first sidewall and the central axis by 1.5 microns to 2.0 microns.

11. The display apparatus of claim 9, wherein a distance between the first sub-sidewall and the central axis is not equal to a distance between the second sub-sidewall and the central axis.

12. The display apparatus of claim 11, wherein the second sub-sidewall is farther away from the central axis of the at least one opening in the direction perpendicular to the substrate than the first sub-sidewall.

13. A display panel with at least one opening, the display panel comprising:
  a substrate;
  a thin film transistor structure layer on the substrate;
  a first inorganic passivation layer on a side of the thin film transistor structure layer distal to the substrate;
  an organic planarization layer on a side of the first inorganic passivation layer distal to the thin film transistor structure layer; and
  a second inorganic passivation layer on a side of the organic planarization layer distal to the first inorganic passivation layer,
  wherein the at least one opening at least penetrates through the first inorganic passivation layer, the organic planarization layer and the second inorganic passivation layer, and the second inorganic passivation layer extends toward the first inorganic passivation layer along a side of the organic planarization layer proximal to the at least one opening and covers an exposed portion of the organic planarization layer proximal to the at least one opening;
  wherein the first inorganic passivation layer has a first sidewall proximal to the at least one opening, and the organic planarization layer has a second sidewall proximal to the at least one opening, and the second sidewall is farther away from a central axis of the at least one opening in a direction perpendicular to the substrate than the first sidewall;
  wherein the organic planarization layer comprises a first organic planarization sub-layer and a second organic planarization sub-layer, the first organic planarization sub-layer is on a side of the first inorganic passivation layer distal to the thin film transistor structure layer, the second organic planarization sub-layer is on a side of the first organic planarization sub-layer distal to the first inorganic passivation layer, the first organic planarization sub-layer has a first sub-sidewall proximal to the at least one opening, and the second organic planarization sub-layer has a second sub-sidewall proximal to the at least one opening;
  the display panel further comprising:
  a first conductive structure on a side of the first organic planarization sub-layer distal to the substrate and electrically coupled to a source of a thin film transistor in the thin film transistor structure layer through a via hole passing through the first organic planarization sub-layer and the first inorganic passivation layer;
  a second conductive structure on a side of the first organic planarization sub-layer distal to the substrate and electrically coupled to a drain of the thin film transistor in the thin film transistor structure layer through a via hole passing through the first organic planarization sub-layer and the first inorganic passivation layer;
  a pixel defining layer on a side of the second inorganic passivation layer distal to the second organic planarization layer and having at least one aperture exposing the second inorganic passivation layer; and
  a light emitting device, which comprises a first electrode, a light emitting layer, and a second electrode, wherein the first electrode and the light emitting layers are in one of the at least one aperture, the second electrode covers the light emitting layer and an exposed portion of the pixel defining layer, and the first electrode is electrically coupled to the second conductive structure through a via hole passing through the second inorganic passivation layer and the second organic planarization sub-layer.

14. A display apparatus comprising the display panel of claim 13 and a driving circuit for driving the display panel.

15. The display apparatus of claim 14, wherein a distance between the second sidewall and the central axis is greater than a distance between the first sidewall and the central axis by 1.5 microns to 2.0 microns.

16. The display apparatus of claim 14, wherein a distance between the first sub-sidewall and the central axis is not equal to a distance between the second sub-sidewall and the central axis.

17. The display apparatus of claim 16, wherein the second sub-sidewall is farther away from the central axis of the at least one opening in the direction perpendicular to the substrate than the first sub-sidewall.

18. A display panel with at least one opening, the display panel comprising:
  a substrate;
  a thin film transistor structure layer on the substrate;
  a first inorganic passivation layer on a side of the thin film transistor structure layer distal to the substrate;
  an organic planarization layer on a side of the first inorganic passivation layer distal to the thin film transistor structure layer; and
  a second inorganic passivation layer on a side of the organic planarization layer distal to the first inorganic passivation layer,
  wherein the at least one opening at least penetrates through the first inorganic passivation layer, the organic planarization layer and the second inorganic passivation layer, and the second inorganic passivation layer extends toward the first inorganic passivation layer along a side of the organic planarization layer proximal to the at least one opening and covers an exposed portion of the organic planarization layer proximal to the at least one opening;

the display panel comprises at least one bending region, wherein the at least one opening is in the bending region.

19. The display panel of claim 18, wherein the at least one bending region is at corners of the display panel.

20. A display apparatus comprising the display panel of claim 18 and a driving circuit for driving the display panel.

* * * * *